United States Patent
Ventzek et al.

(10) Patent No.: US 7,572,386 B2
(45) Date of Patent: Aug. 11, 2009

(54) METHOD OF TREATING A MASK LAYER PRIOR TO PERFORMING AN ETCHING PROCESS

(75) Inventors: Peter L.G. Ventzek, Austin, TX (US); Lee Chen, Cedar Creek, TX (US); Akira Koshiishi, Kofu (JP); Ikuo Sawada, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 74 days.

(21) Appl. No.: 11/499,679

(22) Filed: Aug. 7, 2006

(65) Prior Publication Data

US 2008/0029483 A1 Feb. 7, 2008

(51) Int. Cl.
*B44C 1/22* (2006.01)
*C03C 15/00* (2006.01)
*C03C 25/68* (2006.01)
*C23F 1/00* (2006.01)

(52) U.S. Cl. .............................. 216/67; 438/711
(58) Field of Classification Search .............. 216/67, 216/68; 438/711, 712
See application file for complete search history.

(56) References Cited

U.S. PATENT DOCUMENTS

| 4,357,369 A | 11/1982 | Kilichowski et al. |
| 5,597,438 A | 1/1997 | Grewal et al. |
| 6,093,332 A | 7/2000 | Winniczek et al. |
| 6,358,670 B1 | 3/2002 | Wong et al. |
| 6,774,044 B2 | 8/2004 | Ke et al. |
| 2006/0037701 A1* | 2/2006 | Koshiishi et al. ....... 156/345.44 |
| 2006/0084276 A1* | 4/2006 | Yu et al. ..................... 438/712 |

OTHER PUBLICATIONS

U.S. Appl. No. 11/499,680, filed Aug. 7, 2006, Ventzek et al.
U.S. Appl. No. 11/499,678, filed Aug. 7, 2006, Ventzek et al.
U.S. Appl. No. 11/499,679, filed Aug. 7, 2006, Ventzek et al.
Frank Greer, "Fluorine Atom Subsurface Diffusion and Reaction in Photoresist", Journal of Applied Physics, vol. 94, No. 12, Dec. 15, 2003, pp. 7453-7461.
Frank Greer, et al., "Vacuum Beam Studies of Photoresist Etching Kinetics", J. Vac. Sci. Technol A, vol. 18, No. 5, Sep./Oct. 2000, pp. 2288-2294.
Frank Greer, et al., "Fundamental Beam Studies of Deuterium and Fluorine Radical Reaction Kinetics on Surfaces", J. Vac. Sci. Technol B, vol. 21, No. 4, Jul./Aug. 2003, pp. 1391-1402.
Frank Greer, et al., "Deuterium and Fluorine Radical Reaction Kinetics on Photoresist", J. Vac. Sci. Technol B, vol. 20, No. 1, Jan./Feb. 2002, pp. 145-153.

(Continued)

*Primary Examiner*—Roberts Culbert
(74) *Attorney, Agent, or Firm*—Oblon, Spivak, McClelland, Maier & Neustadt, P.C.

(57) ABSTRACT

A method of pre-treating a mask layer prior to etching an underlying thin film is described. A thin film, such as a dielectric film, is etched using plasma that is enhanced with a ballistic electron beam. In order to reduce the loss of pattern definition, such as line edge roughness effects, the mask layer is treated with an electron beam in the absence of an atomic halogen specie prior to proceeding with the etching process.

19 Claims, 8 Drawing Sheets

OTHER PUBLICATIONS

Frank Greer, et al., "Argon and Oxygen Ion Chemistry Effects in Photoresist Etching", J. Vac. Sci. Technol B, vol. 20, No. 5, Sep./Oct. 2002, pp. 1901-1906.

C. H. Lee, et al., "Effect of different frequency combination on Arf photoresist deformation and silicon dioxide etching in the dual frequency superimposed capacitively coupled plasmas", J. Vac. Sci. Technol A, vol. 24, No. 4, Jul./Aug. 2006, pp. 1386-1394.

N. Negishi, "Deposition Control for Reduction of 193 NM Photoresist Degradation in Dielectric Etching", J. Vac. Sci. Technol B, vol. 23, No. 1, Jan./Feb. 2005, pp. 217-223.

* cited by examiner

METHOD OF TREATING A MASK LAYER PRIOR TO PERFORMING AN ETCHING PROCESS

BACKGROUND OF THE INVENTION

1. Field of the Invention

The present invention relates to a method of etching a thin film on a substrate in a plasma processing system, and more particularly to a method for treating a mask layer on the thin film prior to etching the thin film using plasma assisted by a ballistic electron beam.

2. Description of Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Exemplary substrate materials where etching may be required include silicon dioxide ($SiO_2$), low-k dielectric materials, poly-silicon, and silicon nitride.

SUMMARY OF THE INVENTION

An object of the present invention is to provide an improved method and system for etching a dielectric.

Another object of the invention is to provide an improved method and system for treating a patterned mask layer to facilitate an etching process.

These and/or objects of the invention are provided by a method of etching a thin film formed on a substrate and having a patterned mask layer thereon. The method includes treating the mask layer with a pre-etching electron beam in the absence of an atomic halogen specie in order to alter the mask layer, and following the treating the mask layer, etching the thin film in a plasma processing system in order to transfer a pattern of the mask to the thin film. The etching includes forming an etching plasma from an etching gas, coupling direct current (DC) power to an electrode in the plasma processing system to form an etching electron beam to assist the etching plasma during the etching that includes, and exposing the substrate to the etching plasma and the etching electron beam.

Another aspect of the invention includes a method of etching a thin film on a substrate using a plasma processing system having a ballistic electron beam. The method includes forming a mask layer on the thin film, the mask layer including a pattern, forming a first electron beam in the absence of an atomic halogen specie and exposing the substrate having the mask layer to the first electron beam to treat the mask layer. Also included is forming an etching plasma in the plasma processing system from an etching gas, forming a second electron beam in the plasma processing system and exposing the substrate to the etching plasma and the second electron beam in order to transfer the pattern to the thin film.

Still another aspect of the invention includes a plasma processing system configured to etch a thin film having a mask layer on a substrate. The system includes a processing chamber, a gas supply system configured to supply a gas to the processing chamber, a substrate holder coupled to the processing chamber and configured to support the substrate and an electrode provided in an interior of the processing chamber. An AC power system is coupled to the processing chamber, and configured to couple at least one AC signal to the substrate holder or the electrode or both in order to form a plasma within the processing chamber, and a DC power system coupled to the processing chamber and configured to couple a DC voltage to the electrode in order to form a ballistic electron beam through the plasma. A controller is configured to control the gas supply system, the AC power system and the DC power system to perform the following steps: treating the mask layer with a pre-etching electron beam in the absence of an atomic halogen specie in order to alter the mask layer, and, following the treating the mask layer, forming a plasma and a ballistic electron beam in the plasma processing system in order to etch the thin film and transfer a pattern of the patterned mask to the thin film.

DETAILED DESCRIPTION OF PREFERRED EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers. For example, the mask layer may include a layer of light-sensitive material, such as photo-resist, and an underlying anti-reflective coating (ARC) layer.

During pattern etching, a dry plasma etching process is often utilized, wherein plasma is formed from a process gas by coupling electro-magnetic (EM) energy, such as radio frequency (RF) power, to the process gas in order to heat electrons and cause subsequent ionization and dissociation of the atomic and/or molecular composition of the process gas. Furthermore, negative, high voltage direct current (DC) electrical power can be coupled to the plasma processing system in order to create an energetic (ballistic) electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Enhancement of the dry plasma etch process is believed to be due to the ballistic electrons altering the mask layer such that, for example, it becomes more resistant to the etch process resulting in improved etch selectivity. Additional details regarding the generation of a ballistic electron beam are disclosed in pending U.S. patent application Ser. No. 11/156,559, entitled "Plasma processing apparatus and method" and published as US patent application no. 2006/0037701A1, the entire contents of which are herein incorporated by reference.

Figure 1:
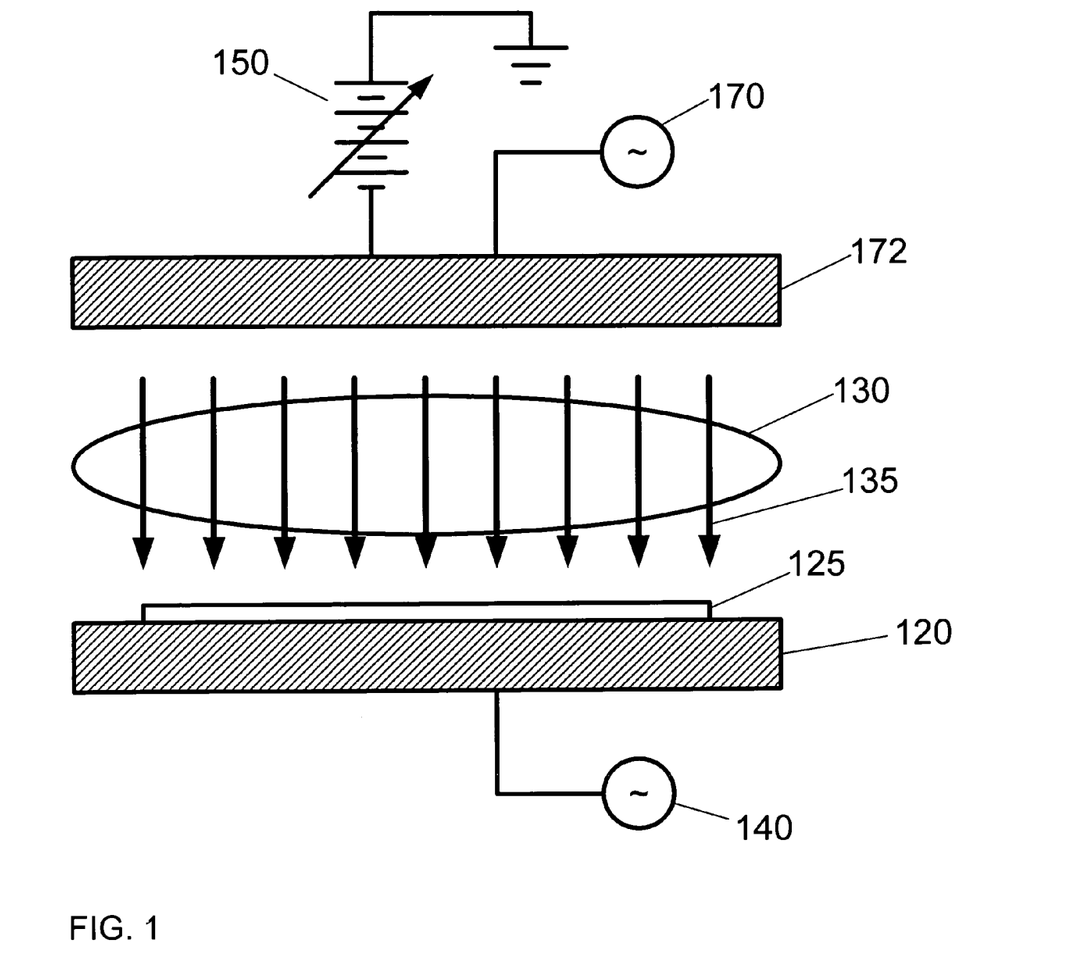
FIG. 1 presents a schematic representation of a plasma processing system according to an embodiment of the invention.

Referring now to FIG. 1, a schematic illustration of a plasma processing system incorporating a ballistic electron beam is provided. The plasma processing system comprises a first electrode 120 and a second electrode 172 disposed opposite each other within a process chamber, wherein the first electrode 120 is configured to support a substrate 125. The first electrode 120 is coupled to a first RF generator 140 configured to provide RF power at a first RF frequency, while the second electrode 172 is coupled to a second RF generator 170 configured to provide RF power at a second RF frequency, which can be the same or different from the first RF frequency. For example, the second RF frequency can be at a relatively higher RF frequency than the first RF frequency. The coupling of RF power to the first and second electrodes facilitates the formation of plasma 130.

Additionally, the plasma processing system comprises a DC power supply 150 configured to provide a DC voltage to the second electrode 172. The coupling of a negative DC voltage (for example) to the second electrode 172 facilitates the formation of ballistic electron beam 135. The electron beam power is derived from the superposition of the negative DC voltage on the second electrode 172. As is described in published US patent application no. 2006/0037701A1, the application of negative DC power to the plasma processing system affects the formation of a ballistic (or collision-less) electron beam that strikes the surface of substrate 125.

In general, the ballistic electron beam can be implemented with any type of plasma processing system, as will be shown below. In this example, the negative DC voltage is superimposed on a RF powered capacitively coupled plasma (CCP) processing system. Hence, the invention is not to be limited by this example. It is merely utilized for illustration purposes.

While the ballistic electron beam is important for enhancing etch properties, the inventors have observed that in many cases use of the ballistic electron beam causes striations or pattern abnormalities (often referred to as "line edge roughness" (LER)) to evolve within the mask layer. In particular, the inventors have observed that LER occurs most often with relatively low polymer-forming (e.g., relatively low $CF_2$ radical content) etch chemistries (e.g., $CF_4$ chemistry), and less often with relatively high polymer-forming (e.g., relatively high $CF_2$ radical content) etch chemistries (e.g., $C_4F_8$ or $C_5F_8$ chemistry). Such pattern abnormalities and sidewall roughness can be transferred to the underlying layers during the current etching process and/or subsequent etching processes. For example, during the initial exposure of the substrate to an etching process having bond-breaking excitation, such as a ballistic electron beam assisted plasma, the mask layer can be altered such that the pattern formed in the mask layer exhibits sidewall roughness (or pattern abnormalities) which are transferred to the etched film as the etching process proceeds. This can lead to reduced manufacturing yields and/or poor device performance and reliability.

The inventors have studied the characteristics of the ballistic electron beam assisted plasma in an effort to determine the cause of the above-described LER problems. The inventors believe that although prolonged exposure of the mask layer, such as a photo-resist layer, to an energetic electron beam (e.g., electron energy in excess of approximately 100 eV) can alter the mask layer to enhance the etch process as noted above, initial exposure to the electron beam causes damage, including electron-induced defects, that may lead to the formation of striations in the mask layer (referred to as LER) when atomic halogen species are present. For example, when the mask layer is exposed to the above-noted fluorine-containing etch chemistries it is believed that the disruption of chemical bonds in the surface layers of the mask layer leads to fluorine oxidation (by atomic fluorine) and the removal of carbon, hydrogen and oxygen from the surface of the mask layer (to a depth determined by the energy of the incident electrons). Generally, the inventors believe that in a conventional ballistic electron beam etching process it is the initial exposure of the mask layer to atomic halogen species in the presence of the ballistic electron beam that can cause LER, even though subsequent exposure to atomic halogen species in the presence of the ballistic electron beam may be beneficial to the etching process.

Thus, the inventors expect that treating the mask layer prior to performing the etching process can reduce the evolution of LER during the etching process. The mask layer may comprise a silicon-containing layer or a non-silicon-containing layer. Additionally, the mask layer may comprise a light-sensitive material, such as photo-resist. For example, the mask layer may comprise a 248 nanometer (nm) photo-resist, a 193 nm photo-resist, a 157 nm photo-resist, or an EUV (extreme ultraviolet) photo-resist, or a combination of two or more thereof.

According to one embodiment, the patterned mask layer is exposed to an oxygen-containing plasma or a halogen-containing plasma or a noble gas plasma or a combination of two or more thereof prior to performing the etching process that transfers the pattern formed in the mask layer to the underlying thin film. The mask layer is treated by the oxygen-containing plasma or the halogen-containing plasma or the noble gas plasma or a combination of two or more thereof in the absence of bond-breaking excitation, such as energetic electrons or energetic photons. Preferably, the treatment plasma is a plasma that results in little or no energetic ions impinging on the patterned mask (i.e., low energy ions at the substrate).

Thus, radio frequency (RF) or microwave power provided to the plasma source is preferably provided at a power level sufficient to dissociate and ionize the oxygen or halogen gas, and ionize the noble gas. In one embodiment, the power to the plasma source is approximately 2000 W or less, and desirably, the power to the plasma source is approximately 500 W or less. Additionally, the bias power to the substrate electrode is less than approximately 500 W, and desirably, the bias power is less than approximately 100 W, and more desirably, the bias power comprises substantially no power applied to the substrate electrode. Further, the treatment plasma is performed for approximately 1 to 30 seconds, and desirably, the treatment plasma is performed for approximately 2 to 20 seconds, for example about 10 seconds.

The exposure of the mask layer can be performed within the plasma processing system utilized for the etching process, such as the plasma processing system illustrated in FIG. 1, or the exposure may be performed in another substrate processing system other than the plasma processing system within which the etching process is performed. Plasma may be formed in-situ using the plasma generation system that facilitates the formation of plasma during the etching process, or plasma may be formed ex-situ using a remote plasma generation system that is coupled to the plasma processing system within which the etching process is performed or the separate substrate processing system.

The oxygen-containing plasma may be formed from $O_2$, CO, $CO_2$, NO, $N_2O$, or $NO_2$, or a combination of two or more thereof. The oxygen containing gas can have a flow rate of approximately 10 sccm (standard cubic centimeters per minute) to approximately 1000 sccm, for example about 100 to 300 sccm. The chamber pressure can be approximately 1 mTorr to approximately 1000 mTorr, and desirably, the chamber pressure can be approximately 50 mTorr to approximately 500 mTorr, and more desirably, the chamber pressure can be approximately 100 mTorr to approximately 500 mTorr. The oxygen-containing plasma may further comprise an inert gas, a noble gas, $N_2$, $H_2$, or CN. The inventors believe that the use of an oxygen-containing plasma may promote the formation of a sub-layer within the mask layer having an increased concentration of oxygen. It is expected by the inventors that this treated mask layer will aid in the reduction of LER in the mask layer in the subsequent etch process. For example, in the case of a silicon-containing mask layer, a "glassy" (i.e., $SiO_x$) sub-layer may be formed, which is expected to be particularly resilient to the formation of LER.

In one example, the treatment of the mask layer by an oxygen-containing plasma is performed in the plasma processing system within which the etching process is performed. The process conditions can include: a flow rate of oxygen-containing gas ranging from approximately 100 sccm to approximately 500 sccm; a chamber pressure greater than or equal to approximately 100 mTorr; little or no RF bias power to the lower electrode (upon which the substrate rests); RF power to the upper electrode (or inductive coil) of approximately 500 W; and a treatment time of approximately 10 seconds. In another example, the treatment of the mask layer by an oxygen-containing plasma is performed using an ex-situ (or remote) plasma source, such as a microwave power plasma source. The process conditions can include: a flow rate of oxygen-containing gas ranging from approximately 100 sccm to approximately 500 sccm; a chamber pressure greater than or equal to approximately 100 mTorr; little or no RF bias power to the lower electrode (upon which the substrate rests); microwave power of approximately 1000 W; and a treatment time of approximately 10 seconds.

The halogen-containing plasma may be formed from $Cl_2$, $Br_2$, $F_2$, HBr, HCl, HF, $C_2H_4Br_2$, $ClF_3$, $NF_3$, $SiCl_4$, or $SF_6$, or a combination of two or more thereof. The halogen containing gas can have a flow rate of approximately 10 sccm to approximately 1000 sccm, for example about 100 to 300 sccm. The chamber pressure can be approximately 1 mTorr to approximately 1000 mTorr, and desirably, the chamber pressure can be approximately 20 mTorr to approximately 500 mTorr, and more desirably, the chamber pressure can be approximately 20 mTorr to approximately 100 mTorr. The halogen-containing plasma may further comprise an inert gas, a noble gas, $N_2$, $H_2$, or CN. Additionally, the halogen-containing plasma may further comprise an oxygen-containing gas. The inventors expect that the exposure of the mask layer to a halogen-containing plasma, in the absence of an energetic electron beam, will passivate the surface layers of the mask layer, thus aiding in the reduction of LER in the mask layer in the following etch process.

In one example, the treatment of the mask layer by a halogen-containing plasma is performed in the plasma processing system within which the etching process is performed. The process conditions can include: a flow rate of halogen-containing gas ranging from approximately 100 sccm to approximately 500 sccm; a chamber pressure ranging from approximately 25 mTorr to approximately 50 mTorr; little or no RF bias power to the lower electrode (upon which the substrate rests); RF power to the upper electrode (or inductive coil) of approximately 100 W to approximately 500 W; and a treatment time of approximately 10 seconds. In another example, the treatment of the mask layer by a halogen-containing plasma is performed using an ex-situ (or remote) plasma source, such as a microwave power plasma source. The process conditions can include: a flow rate of halogen-containing gas ranging from approximately 100 sccm to approximately 500 sccm; a chamber pressure greater than or equal to approximately 100 mTorr; little or no RF bias power to the lower electrode (upon which the substrate rests); microwave power of approximately 1000 W; and a treatment time of approximately 10 seconds.

The noble gas plasma may be formed from a noble gas, e.g., He, Ne, Ar, Xe, Kr, or a combination of two or more thereof. The noble gas can have a flow rate of approximately 10 sccm to approximately 1000 sccm, for example about 100 to 300 sccm. The chamber pressure can be approximately 1 mTorr to approximately 1000 mTorr, and desirably, the chamber pressure can be approximately 50 mTorr to approximately 500 mTorr, and more desirably, the chamber pressure can be approximately 50 mTorr to approximately 200 mTorr. The inventors believe that the use of a noble gas plasma may promote the formation of a carbon-rich, or "carbonized", surface layer on the mask layer (i.e., depleted of O and H, for instance). The "carbonized" surface layer may extend several nanometers (nm) into the mask layer (e.g., 1 to 10 nm), depending upon the ion energy of ions striking the mask layer. For example, ions having an energy ranging from approximately 25 to approximately 50 eV should penetrate approximately 1 nm to approximately 2 nm. It is expected by the inventors that this treated mask layer will aid in the reduction of LER in the mask layer in the subsequent etch process.

In one example, the treatment of the mask layer by a noble gas plasma is performed in the plasma processing system within which the etching process is performed. The process conditions can include: a flow rate of noble gas ranging from approximately 100 sccm to approximately 300 sccm; a chamber pressure ranging from approximately 25 mTorr to approximately 50 mTorr; little or no RF bias power to the lower electrode (upon which the substrate rests); RF power to the upper electrode (or inductive coil) of approximately 500 W to approximately 1000 W; and a treatment time of approximately 10 seconds.

According to another embodiment, a protective layer is formed on the mask layer prior to performing the etching process that transfers the pattern formed in the mask layer to the underlying thin film. The protective layer that is formed on the mask layer can comprise a material layer that may be consumed or partially consumed during the etching process and, thereby, protect the mask layer during the early stages of the etching process. Alternatively, the protective layer that is formed on the mask layer may provide increased etch resistance during the etching process and, in particular, provide increased etch resistance during the early stages of the etching process.

The formation of the protective layer on the mask layer can be performed in the plasma processing system within which the etching process is performed, such as the plasma processing system illustrated in FIG. 1, or the exposure may be performed in another substrate processing system other than the plasma processing system within which the etching process is performed. Plasma may be formed in-situ using the plasma generation system that facilitates the formation of plasma during the etching process, or plasma may be formed ex-situ using a remote plasma generation system that is coupled to the plasma processing system within which the etching process is performed or to the separate substrate processing system.

When forming a protective layer on the mask layer, a depositing gas plasma is utilized, wherein exposure of the mask layer to the depositing gas plasma results in a net deposition of material on the substrate surface. The formation of the protective layer on the mask layer can include exposing the mask layer to a depositing gas plasma, such as a hydrocarbon-containing plasma (i.e., $C_xH_y$-containing plasma, wherein x and y represent integers greater than or equal to unity), or a fluorocarbon-containing plasma ($C_xF_z$-containing plasma, wherein x and z represent integers greater than or equal to unity), or a hydrofluorocarbon-containing plasma ($C_xH_yF_z$-containing plasma, wherein x, y and z represent integers greater than or equal to unity), or a combination of two or more thereof. The mask layer is treated by the depositing gas plasma in the absence of bond-breaking excitation, such as energetic electrons or energetic photons. The $C_xH_y$-containing plasma may be formed using $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or a combination of two or more thereof. The $C_xF_z$-containing plasma may be formed using $C_2F_6$, $CF_4$, $C_3F_8$, $C_4F_8$, $C_5F_8$, or $C_4F_6$, or a combination of two or more thereof. The $C_xH_yF_z$-containing plasma may be formed using $CH_3F$, $C_2HF_5$, $CH_2F_2$, or $CHF_3$, or a combination of two or more thereof.

Process conditions are selected to form a protective layer of hydrocarbon, or fluorocarbon, or combination thereof on the mask layer using one or more of the depositing gases described above. The process conditions should be selected such that the pattern formed in the mask layer is not closed off, or "pinched" off. The protective layer can cover the flat-field. Additionally, the protective layer may comprise some overhang on the pattern, and may further comprise some coverage of the sidewalls of the pattern in the mask layer. For example, the process conditions should be selected to form an ion-driven depositing plasma (i.e., deposition of ionized species) with little or no sputtering (i.e., low ion energy at the substrate surface). The depositing gas can have a flow rate of approximately 10 sccm to approximately 1000 sccm, and desirably, the flow rate may range from approximately 100 sccm to approximately 300 sccm, for example about 200 sccm. The chamber pressure can be approximately 1 mTorr to approximately 1000 mTorr, and desirably, the chamber pressure can be approximately 50 mTorr to approximately 500 mTorr, and more desirably, the chamber pressure can be approximately 50 mTorr to approximately 200 mTorr. Additionally, the depositing gas plasma may further comprise a diluent gas, such as a noble gas. For example, the flow rate of depositing gas can range from approximately 1% to approximately 20% of the gas mixture, while the remainder includes the flow rate of diluent gas. Additionally, for example, the flow rate of depositing gas can range from approximately 5% to approximately 10% of the gas mixture, while the remainder includes the flow rate of diluent gas. Further yet, the depositing gas may also include $H_2$, $O_2$, CO, $CO_2$, NO, $N_2O$, $NO_2$, $N_2$, CN, or an inert gas, or a combination of two or more thereof.

In one example, when depositing a CF (i.e., $C_xF_z$) polymer, a depositing gas, such as $C_4F_8$ or $C_4F_6$ with or without $CF_4$, may be used. The process conditions can include: a flow rate of diluent gas ranging from approximately 100 sccm to approximately 500 sccm; a flow rate of depositing gas ranging from approximately 1% to approximately 20% of the diluent gas flow rate; a chamber pressure ranging from approximately 50 mTorr to approximately 200 mTorr; little or no RF bias power to the lower electrode (upon which the substrate rests); RF power to the upper electrode (or inductive coil) of approximately 500 W to approximately 1500 W; and a treatment time sufficient to form a film having a thickness ranging from approximately several nm to approximately 200 nm.

In another example, when depositing a CH (i.e., $C_xH_y$) polymer, the process conditions can include: a flow rate of diluent gas ranging from approximately 100 sccm to approximately 500 sccm; a flow rate of depositing gas ranging from approximately 1% to approximately 20% of the diluent gas flow rate; a chamber pressure ranging from approximately 50 mTorr to approximately 200 mTorr; little or no RF bias power to the lower electrode (upon which the substrate rests); RF power to the upper electrode (or inductive coil) of approximately 500 W to approximately 1500 W; and a treatment time sufficient to form a film having a thickness ranging from approximately several nm to approximately 200 nm.

The required thickness of the protective layer may be larger for a CH film relative to a CF film, since the inventors believe the CF film may provide relatively greater etch resistance during the etching process. The minimum thickness of the protective layer should be selected according to the penetration depth of the charged species in the etching process. For instance, a film having a thickness of approximately 50 nm may be required for a 1 keV electron beam, and a film having a thickness of approximately 100 nm may be required for a 1.5 keV electron beam.

In yet another example, the formation of the protective layer on the mask layer can include immersing the mask layer in alcohol, such as methanol or ethanol.

It is expected by the inventors that the formation of a protective layer on the mask layer using a hydrocarbon-based chemistry or hydrofluorocarbon-based chemistry will increase the hydrogen content at the surface of the mask layer, thereby attenuating energetic electrons during the initial stages of the etching process. By mitigating the damaging effect of energetic electrons during these initial stages of the etching process, the sacrificial layer can aid in the reduction of LER in the mask layer in the following etch process. Additionally, it is expected by the inventors that the formation of a protective layer on the mask layer using a hydrofluorocarbon-based chemistry or a fluorocarbon-based chemistry will facilitate the formation of a polymer film that provides additional etch resistance for the mask layer during the etching process. Improving the etch selectivity to the modified mask layer can aid in the reduction of LER in the mask layer following the etch process.

According to yet another embodiment, the mask layer is treated by an electron beam in the absence of atomic halogen species (i.e., F, Cl, Br, etc.) prior to performing the etching process. The inventors expect that exposure of the mask layer to an electron beam in the absence of atomic halogen species will "cure" or harden the surface layers of the mask layer, thus making the mask layer less susceptible to the formation of LER during the etching process.

The exposure of the mask layer to an electron beam can be performed in the plasma processing system within which the etching process is performed, such as the plasma processing system illustrated in FIG. 1, or the exposure may be performed in another substrate processing system other than the plasma processing system within which the etching process is performed. For example, an electron beam source may be coupled to the plasma processing system (for the etching process) or the other substrate processing system, and may be configured to generate an electron beam for treating the mask layer.

Alternatively, for example, an electron beam may be generated within the plasma processing system by coupling direct current (DC) power to an electrode within the plasma processing system (as described in FIG. 1, and FIGS. 2 through 7 below), and forming plasma. Referring to FIG. 1, a pre-etching plasma can be formed by coupling alternating current (AC) power, such as radio frequency (RF) power, to the first electrode 120, or the second electrode 172, or both, and a pre-etching electron beam may be formed by coupling DC power to the second electrode 172.

Using a pre-etching electron beam, the surface layer of the mask layer can be treated prior to the etching process. The depth for treatment can range from approximately 1 nm to approximately 100 nm, and desirably, the treatment depth ranges from approximately 5 nm to approximately 50 nm, for example 10 nm. These penetration depths are achievable using electron beam energies ranging from approximately 500 eV to approximately 1.5 keV. The pre-etching electron beam energy can be up to approximately 1.5 keV, and desirably it can range from approximately 200 eV to approximately 1.5 keV, for example 500 eV. The pre-etching electron beam exposure can be selected to produce a dose ranging from approximately $10^{14}$ electrons per square centimeter ($cm^{-2}$) to approximately $10^{16}$ $cm^{-2}$.

In one example, a pre-etching electron beam is formed in the plasma processing system of FIG. 1. The process conditions can include: a flow rate of noble gas ranging from approximately 100 sccm to approximately 300 sccm; a chamber pressure ranging from approximately 20 mTorr to approximately 100 mTorr; little or no RF bias power to the lower electrode (upon which the substrate rests); RF power to the upper electrode (or inductive coil) of approximately 500 W to approximately 1000 W; a DC voltage to the upper electrode ranging from approximately −500 V to approximately −1000 V; and a treatment time of approximately 10 seconds.

The pre-etching plasma may be formed using an inert gas, such as a noble gas (i.e., He, Ne, Ar, Xe, Kr). Additionally, the pre-etching plasma may further comprise $CHF_3$. In the presence of plasma, the dissociation of $CHF_3$ tends to produce populations of $CF_2$ (e.g., polymer-forming radical) and (ionically-bonded) HF. The polymer-forming radical may be beneficial to the treatment of the mask layer by providing a sacrificial layer as described above. However, it is important that additive gases (to the inert plasma-forming gas(es)) should be chosen such that atomic halogen species are absent in the presence of plasma in order to treat the mask layer while reducing the LER problems noted above.

The mask layer can be treated by the pre-etching electron beam and pre-etching plasma for a predetermined period of time, e.g., approximately 10 seconds. Further, the pre-etching electron beam is performed for approximately 1 to 30 seconds, and desirably, the pre-etching electron beam is performed for approximately 2 to 20 seconds, for example about 10 seconds. After this treatment, an etching plasma may be formed using an etching gas, an etching electron beam may be formed, and the etching process may proceed by exposing the substrate with the treated mask layer to the etching electron beam and etching plasma. The pre-etching electron beam energy may be selected to be approximately equivalent to the etching electron beam energy or, alternatively, the pre-etching electron beam energy may be selected to be less than the etching electron beam energy. For example, the pre-etching electron beam energy can be approximately 500 eV, while the etching electron beam energy can be approximately 1500 eV. The electron beam energy (or voltage applied to the second electrode 172 in FIG. 1) may be increased in a step-wise fashion during the pre-etching treatment, or it may be ramped during the pre-etching treatment. Additionally, the electron beam energy (or voltage applied to the second electrode 172 in FIG. 1) may be pulsed. For example, the voltage applied to the second electrode 172 can be pulsed between approximately 0 V and approximately −1500 V, or desirably the voltage can be pulsed between approximately −100 V and approximately −1500 V, or more desirably the voltage can be pulsed between approximately −500 V and approximately −1500 V.

A pre-etching electron beam treatment of the mask layer may also precede a treatment of the mask layer using an oxygen-containing plasma or a halogen-containing plasma or a noble gas plasma. Additionally, a pre-etching electron beam treatment of the mask layer may also precede the formation of a protective layer on the mask layer. For example, the pre-etching electron beam may prepare the surface of the mask layer for polymer growth during the formation of the protective layer.

These embodiments can be implemented with any type of plasma processing system, as will be shown below.

Figure 2:
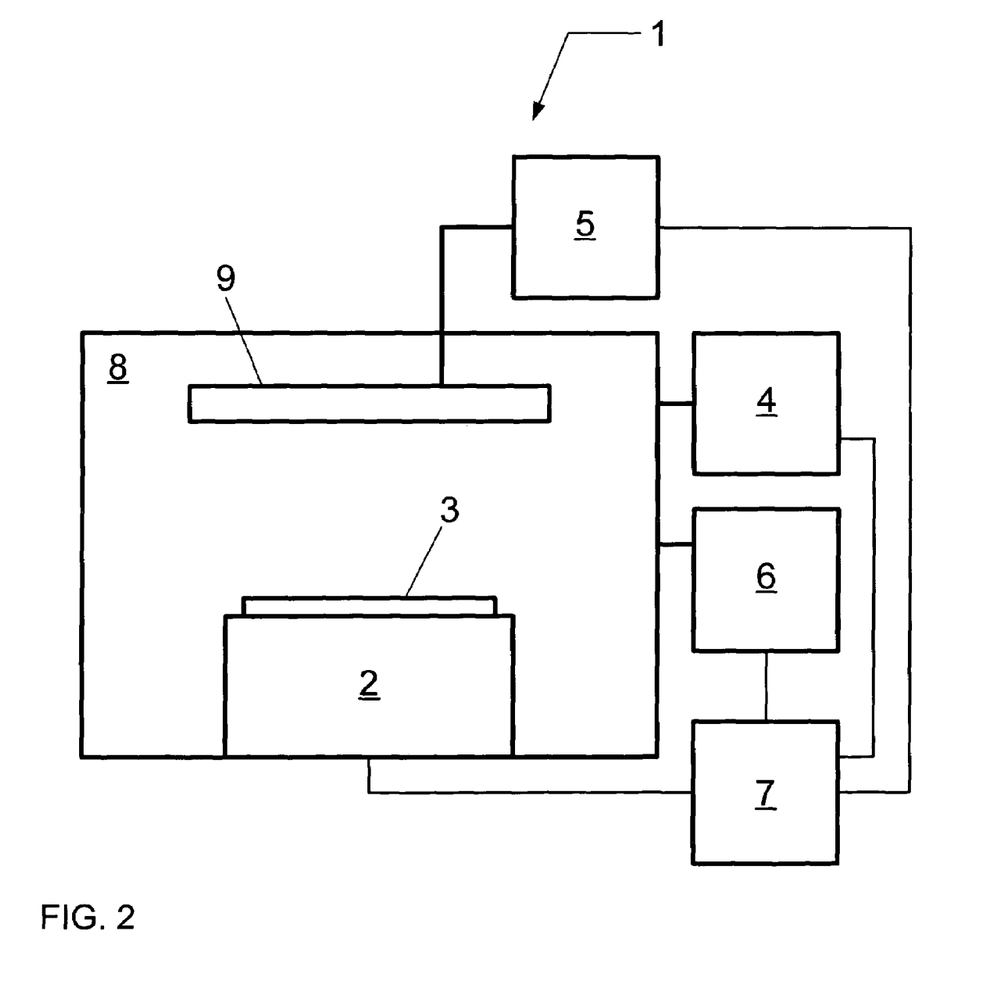
FIG. 2 shows a schematic diagram of a plasma processing system according to another embodiment of the invention.

Referring now to FIG. 2, a plasma processing system configured to treat a mask layer prior to etching an underlying layer using plasma enhanced by a ballistic electron beam is presented according to one embodiment. Plasma processing system 1 comprises a plasma processing chamber 8 configured to facilitate the formation of plasma, a substrate holder 2 coupled to the plasma processing chamber 8 and configured to support the substrate 3, and an electrode 9 coupled to the plasma processing chamber 8 and configured to contact the plasma. Additionally, plasma processing system 1 comprises an AC power system 4 coupled to the plasma processing chamber 8 and configured to couple at least one AC signal to the substrate holder 2 or the electrode 9 or both in order to form the plasma, and a DC power system 5 coupled to the plasma processing chamber 8 and configured to couple a DC voltage to the electrode 9 in order to form a ballistic electron beam through the plasma.

Furthermore, plasma processing system 1 comprises a process gas distribution system 6 coupled to the plasma processing chamber 8 and configured to introduce any of the gases described in the embodiments above. Further yet, plasma processing system 1 comprises a vacuum pumping system (not shown) coupled to the plasma processing chamber 8 and configured to evacuate gases from the processing chamber.

Optionally, plasma processing system 1 further comprises a controller 7 coupled to plasma processing chamber 8, substrate holder 2, AC power system 4, DC power system 5 and process gas distribution system 6, and configured to exchange data with each of these components in order to execute a process within the plasma processing chamber 8 to treat substrate 3. Plasma processing system 1 can facilitate the treatment of the mask layer on substrate 3 or the etching process of substrate 3 or both.

Figure 3:
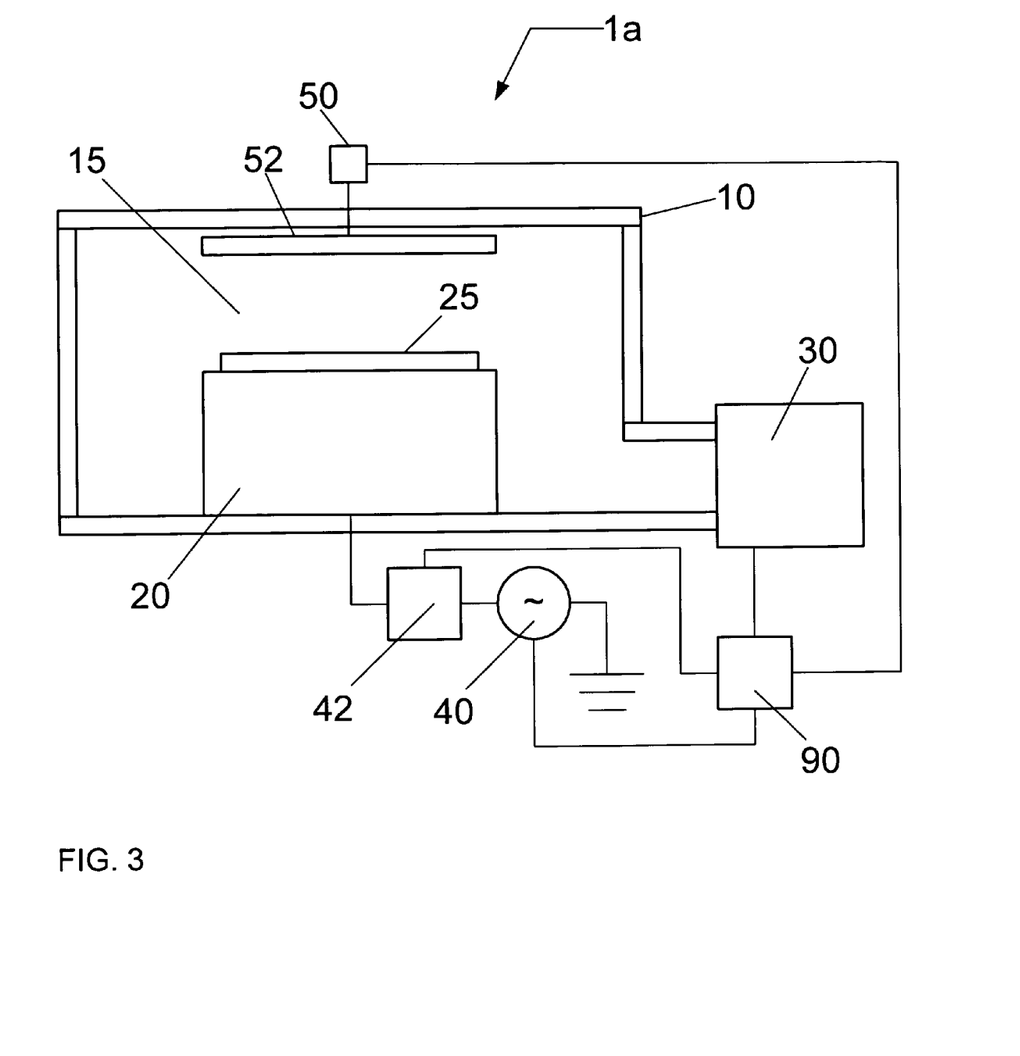
FIG. 3 shows a schematic diagram of a plasma processing system according to another embodiment of the invention.

FIG. 3 illustrates a plasma processing system according to another embodiment. Plasma processing system 1a comprises a plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 can be affixed to the substrate holder 20 via an electrostatic clamping system. Furthermore, substrate holder 20 can further include a cooling system or heating system that includes a re-circulating fluid flow that receives heat from substrate holder 20 and transfers heat to a heat exchanger system (not shown) when cooling, or transfers heat from the heat exchanger system to the fluid flow when heating. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

In the embodiment shown in FIG. 3, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma, or affect the ion energy distribution function within the sheath, or both. In this configuration, the system can operate as a reactive ion etch (RIE) reactor, wherein the chamber can serve as ground surfaces. A typical frequency for the RF bias can range from 0.1 MHz to 100 MHz. RF systems for plasma processing are well known to those skilled in the art.

Furthermore, the amplitude of the RF power coupled to substrate holder 20 can be modulated in order to affect changes in the spatial distribution of the electron beam flux to substrate 25. Additional details can be found in co-pending U.S. patent application Ser. No. 11/495,726, entitled "Method and system for controlling the uniformity of a ballistic electron beam by RF modulation", filed on Jul. 31, 2006; the entire contents of which are incorporated by reference in their entirety.

Furthermore, impedance match network 42 serves to improve the transfer of RF power to plasma in plasma processing chamber 10 by reducing the reflected power. Match network topologies (e.g. L-type, π-type, T-type, etc.) and automatic control methods are well known to those skilled in the art.

Referring still to FIG. 3, plasma processing system 1a further comprises a direct current (DC) power supply 50 coupled to an upper electrode 52 opposing substrate 25. The upper electrode 52 may comprise an electrode plate. The electrode plate may comprise a silicon-containing electrode plate. Moreover, the electrode plate may comprise a doped silicon electrode plate. The DC power supply can include a variable DC power supply. Additionally, the DC power supply can include a bipolar DC power supply. The DC power supply 50 can further include a system configured to perform at least one of monitoring adjusting, or controlling the polarity, current, voltage, or on/off state of the DC power supply 50. Once plasma is formed, the DC power supply 50 facilitates the formation of a ballistic electron beam. An electrical filter may be utilized to de-couple RF power from the DC power supply 50.

For example, the DC voltage applied to electrode 52 by DC power supply 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

Vacuum pump system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Referring still to FIG. 3, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, DC power supply 50, the gas injection system (not shown), vacuum pumping system 30, as well as the backside gas delivery system (not shown), the substrate/substrate holder temperature measurement system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™, available from Dell Corporation, Austin, Tex.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

In the embodiment shown in FIG. 4, the plasma processing system 1b can be similar to the embodiment of FIG. 2 or 3 and further comprise either a stationary, or mechanically or electrically rotating magnetic field system 60, in order to potentially increase plasma density and/or improve plasma processing uniformity, in addition to those components described with reference to FIG. 2. Moreover, controller 90 can be coupled to magnetic field system 60 in order to regulate the speed of rotation and field strength. The design and implementation of a rotating magnetic field is well known to those skilled in the art.

Figure 5:
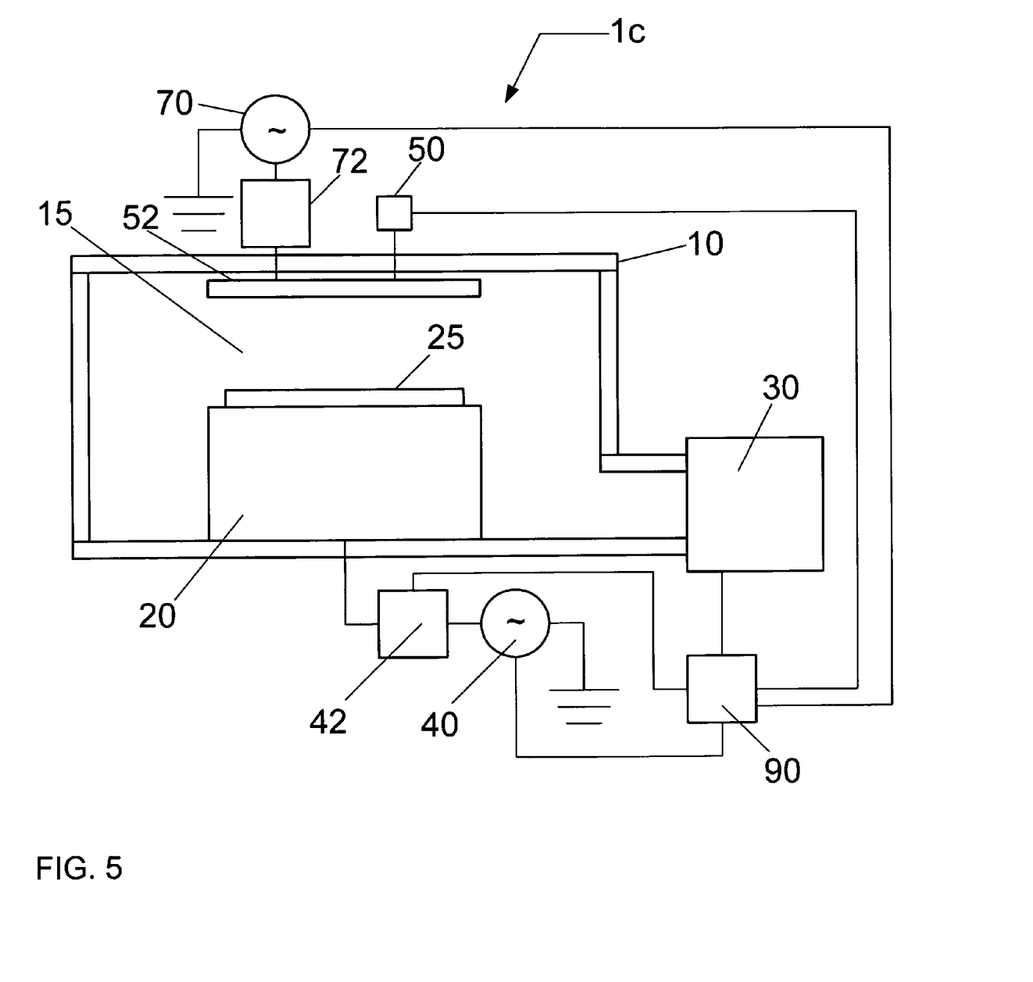
FIG. 5 shows a schematic diagram of a plasma processing system according to another embodiment of the invention.

In the embodiment shown in FIG. 5, the plasma processing system 1c can be similar to the embodiment of FIG. 2 or FIG. 3, and can further comprise an RF generator 70 configured to couple RF power to upper electrode 52 through an optional impedance match network 72. A typical frequency for the application of RF power to upper electrode 52 can range from about 0.1 MHz to about 200 MHz. Additionally, a typical frequency for the application of power to the substrate holder 20 (or lower electrode) can range from about 0.1 MHz to about 100 MHz. For example, the RF frequency coupled to the upper electrode 52 can be relatively higher than the RF frequency coupled to the substrate holder 20. Furthermore, the RF power to the upper electrode 52 from RF generator 70 can be amplitude modulated, or the RF power to the substrate holder 20 from RF generator 40 can be amplitude modulated, or both RF powers can be amplitude modulated. Desirably, the RF power at the higher RF frequency is amplitude modulated. Moreover, controller 90 is coupled to RF generator 70 and impedance match network 72 in order to control the application of RF power to upper electrode 70. The design and implementation of an upper electrode is well known to those skilled in the art.

Referring still to FIG. 5, the DC power supply 50 may be directly coupled to upper electrode 52, or it may be coupled to the RF transmission line extending from an output end of impedance match network 72 to upper electrode 52. An electrical filter may be utilized to de-couple RF power from DC power supply 50.

Figure 4:
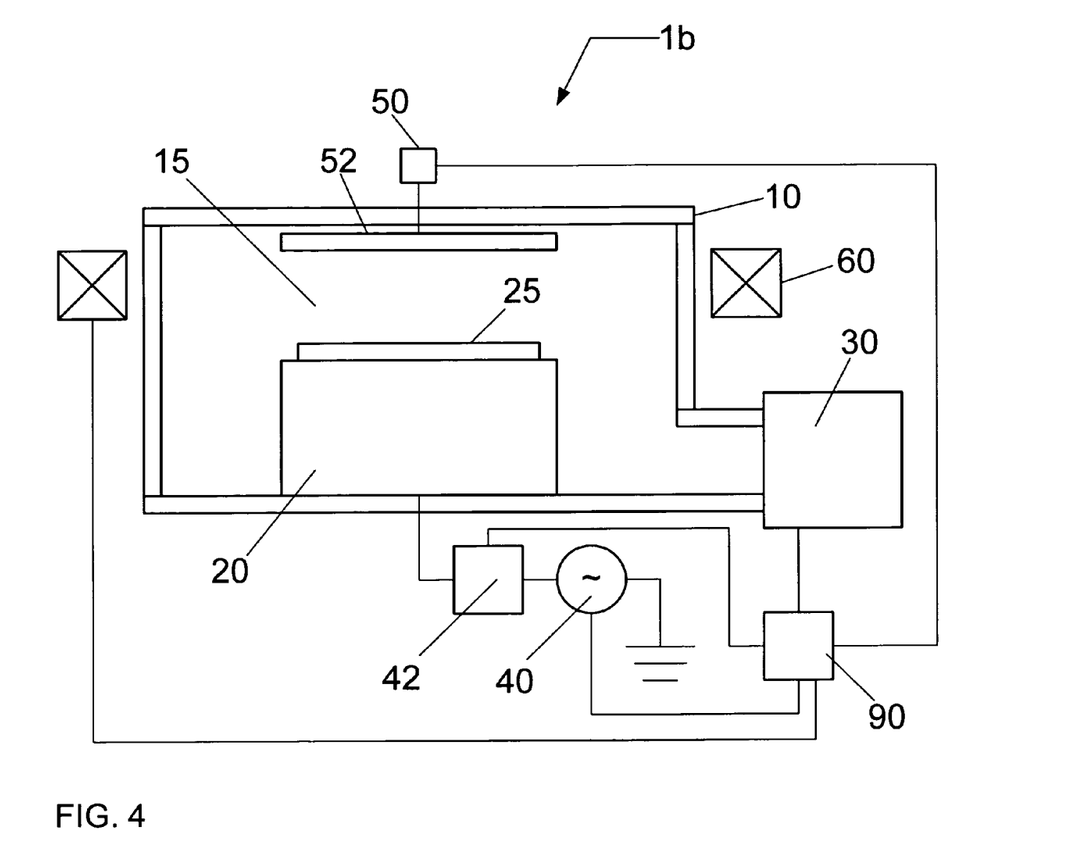
FIG. 4 shows a schematic diagram of a plasma processing system according to another embodiment of the invention.
Figure 6:
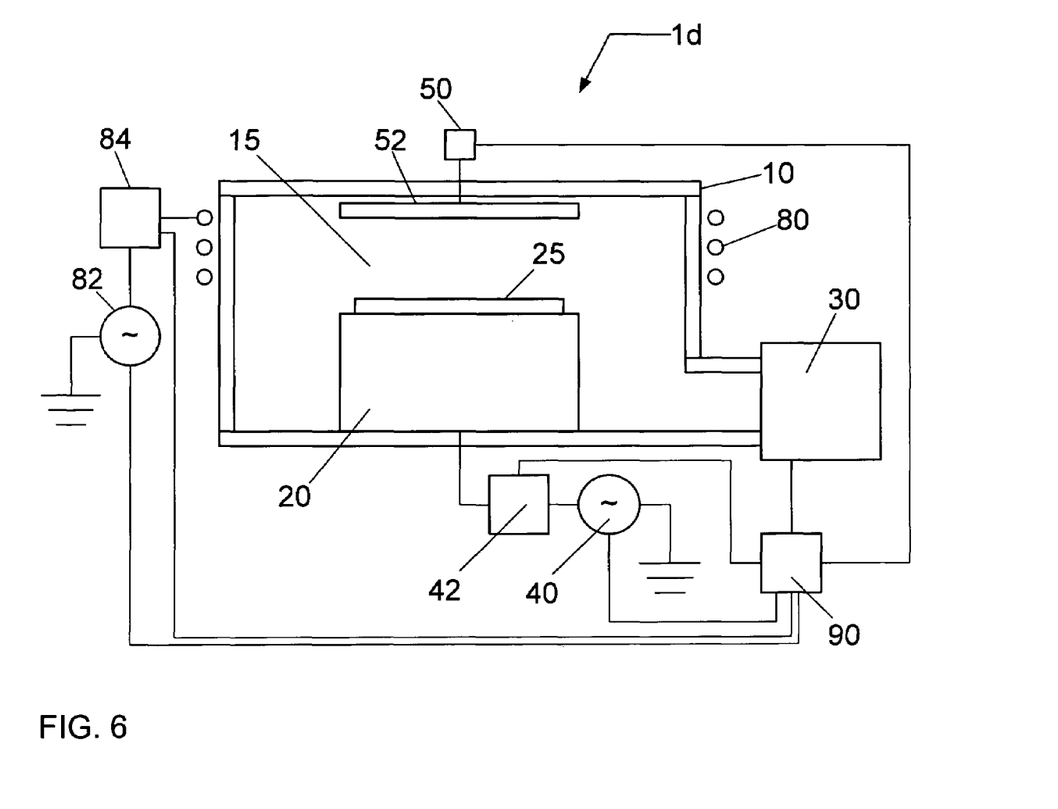
FIG. 6 shows a schematic diagram of a plasma processing system according to another embodiment of the invention.

In the embodiment shown in FIG. 6, the plasma processing system 1d can, for example, be similar to the embodiments of FIGS. 2, 3 and 4, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the substrate holder 20 (or lower electrode) can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 7:
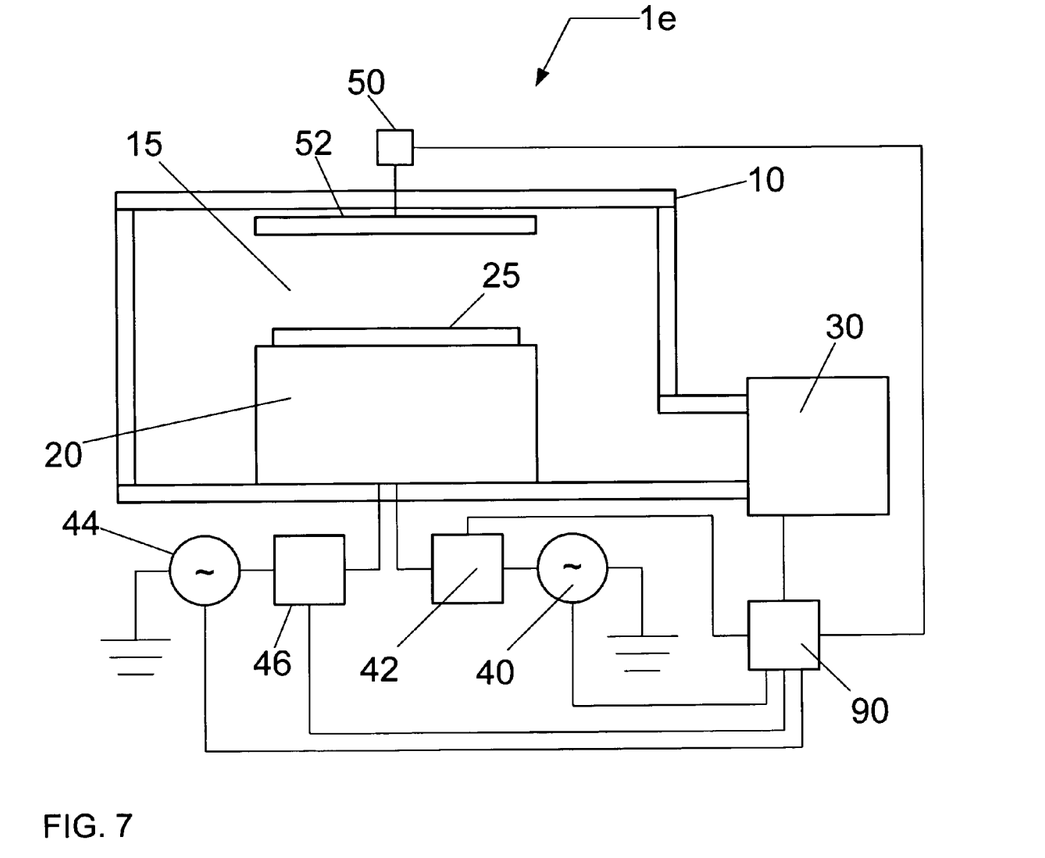
FIG. 7 shows a schematic diagram of a plasma processing system according to another embodiment of the invention.

In the embodiment shown in FIG. 7, the plasma processing system 1e can, for example, be similar to the embodiments of FIGS. 3, 4 and 5, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the first RF generator 40 or the second RF generator 44 or both. The RF frequency for the second RF generator 44 can be relatively greater than the RF frequency for the first RF generator 44. Furthermore, the RF power to the substrate holder 20 from RF generator 40 can be amplitude modulated, or the RF power to the substrate holder 20 from RF generator 44 can be amplitude modulated, or both RF powers can be amplitude modulated. Desirably, the RF power at the higher RF frequency is amplitude modulated. Moreover, controller 90 is coupled to the second RF generator 44 and impedance match network 46 in order to control the application of RF power to substrate holder 20. The design and implementation of an RF system for a substrate holder is well known to those skilled in the art.

In the following discussion, a method of etching a thin film utilizing a plasma processing system with a ballistic electron beam is presented. For example, the plasma processing system can comprise various elements, such as described in FIGS. 1 through 7, and combinations thereof.

Figure 8:
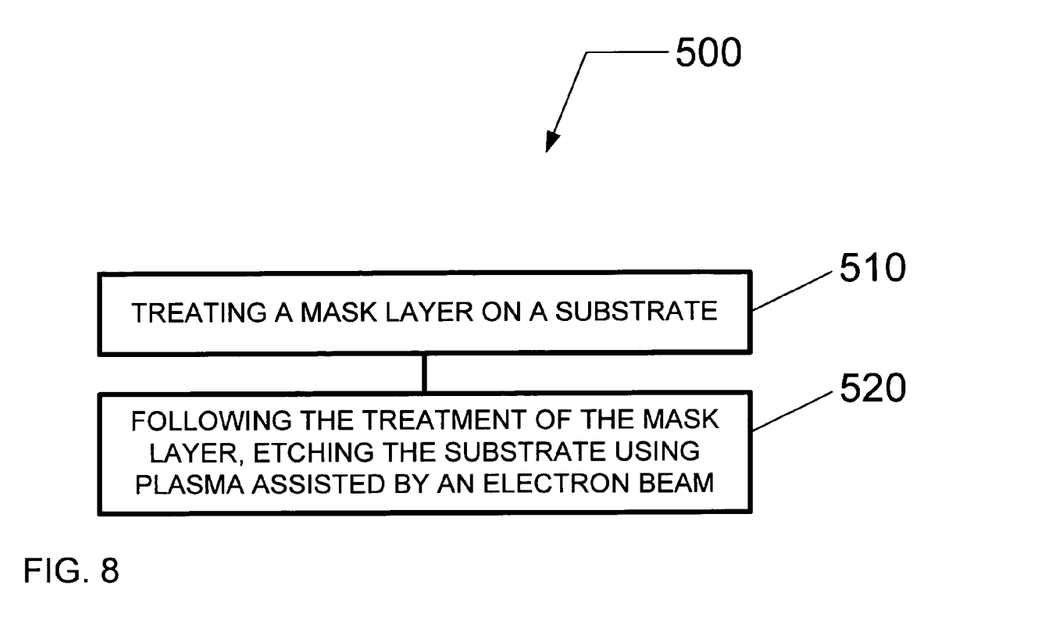
FIG. 8 illustrates a method of treating a substrate using plasma according to an embodiment of the invention.

FIG. 8 presents a flow chart of a method for etching a thin film according to an embodiment of the present invention. Procedure 500 begins at 510 with treating a mask layer, having a pattern formed therein, overlying a thin film on a substrate.

The mask layer may be treated using any of the aforementioned embodiments. For example, the treatment of the mask layer can include the exposure of the mask layer to an oxygen-containing plasma or a halogen-containing plasma or a noble gas plasma or a combination of two or more thereof. Alternatively, the treatment of the mask layer can include the formation of a protective layer on the mask layer. Alternatively yet, the treatment of the mask layer can include the exposure of the mask layer to an electron beam in the absence of atomic halogen species. Alternatively yet, the treatment of the mask layer may comprise any combination of these treatments described above.

In 520, the substrate having the treated mask layer is exposed to a dry etching plasma assisted by an energetic (ballistic) electron beam in order to transfer the pattern formed in the mask layer to the underlying thin film, while reducing pattern abnormalities such as LER. In a plasma processing system, a (process) plasma is formed from a process gas by coupling power to the process gas (to cause ionization and dissociation of process gas molecules). By coupling DC power to an electrode within the plasma processing system and by forming plasma, an energetic (ballistic) electron beam is created having an energy level that depends on the magnitude of DC voltage applied to the electrode.

DC power is coupled to the plasma processing system. For example, the DC voltage applied to the plasma processing system by a DC power supply may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than that is a self-bias voltage generated on an electrode surface of the plasma processing system.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of etching a thin film formed on a substrate and having a mask layer thereon, the method comprising:
   forming a pattern on the mask layer;
   treating said patterned mask layer with a pre-etching first ballistic electron beam formed by coupling negative polarity direct current (DC) power to an electrode in a plasma processing system in the absence of an atomic halogen specie in order to alter said patterned mask layer; and
   following said treating said patterned mask layer, etching said thin film in said plasma processing system in order to transfer a pattern of the mask to said thin film, said etching comprising:
      forming an etching plasma from an etching gas;
      forming a second ballistic electron beam to assist said etching plasma during said etching by coupling negative polarity direct current (DC) power to an electrode in said plasma processing system; and
      exposing said substrate to said etching plasma and said etching electron beam.

2. The method of claim 1, wherein said treating said patterned mask layer with said pre-etching first ballistic electron beam comprises disposing said substrate in said plasma processing system and treating said mask layer using a ballistic electron beam source coupled to said plasma processing system.

3. The method of claim 1, wherein said treating said mask layer with said pre-etching first ballistic electron beam comprises:
   disposing said substrate on a substrate holder within said plasma processing system;
   forming a pre-etching plasma in said plasma processing system from a pre-etching gas;
   coupling negative polarity DC power to said electrode in said plasma processing system to form said pre-etching first ballistic electron beam; and
   exposing said substrate to said pre-etching plasma and said pre-etching ballistic electron beam.

4. The method of claim 3, wherein said forming said pre-etching first ballistic electron beam comprises coupling negative polarity DC power to an upper electrode opposing said substrate on said substrate holder.

5. The method of claim 3, wherein said forming said pre-etching first ballistic electron beam comprises coupling negative polarity DC power, wherein the absolute value of the negative polarity DC power is greater than or equal to approximately 500 V.

6. The method of claim 3, wherein said forming said pre-etching plasma comprises coupling radio frequency (RF) power to said electrode or another electrode other than said electrode or said substrate holder or a combination of two or more thereof said RF power having a total power level less than or equal to 500 W.

7. The method of claim 3, wherein said forming said pre-etching plasma comprises forming said pre-etching plasma from one or more noble gases.

8. The method of claim 7, wherein said forming said pre-etching plasma comprises forming said pre-etching plasma from a mixture of one or more noble gases and $CHF_3$.

9. The method of claim 1, wherein said forming said first or second ballistic electron beam comprises coupling DC power ranging in voltage from approximately −2000 V to approximately −500V.

10. The method of claim 1, wherein said forming said first or second ballistic electron beam comprises coupling DC power having a negative polarity, wherein the absolute value of the negative polarity DC power is greater than or equal to approximately 500 V.

11. The method of claim 1, wherein said forming said first or second ballistic electron beam comprises coupling negative polarity DC power to an upper electrode opposing said substrate which is provided on a substrate holder.

12. The method of claim 11, wherein said forming said etching plasma comprises coupling radio frequency (RF) power to said electrode or another electrode other than said electrode or said substrate holder or a combination of two or more thereof.

13. The method of claim 12, wherein said coupling RF power comprises coupling a first RF power to said upper electrode at a first RF frequency and coupling a second RF power to said substrate holder at a second RF frequency less than said first RF frequency.

14. The method of claim 12, further comprising:
   modulating the amplitude of said RF power in order to adjust the spatial distribution of electron beam flux for said electron beam.

15. The method of claim 1, wherein said treating said mask layer with said pre-etching first ballistic electron beam prior to said etching reduces line edge roughness formed in said mask layer during said etching.

16. The method of claim 1, wherein said treating is performed for a predetermined time for making said patterned mask resistant to line edge roughness formed in the mask layer during said etching.

17. The method of claim 1, wherein the electron beam energy of said pre-etching first ballistic electron beam is less than the electron beam energy of said second ballistic electron beam.

18. The method of claim 1, wherein the electron beam energy of said pre-etching first ballistic electron beam is increased in one or more steps or ramped during said treating said mask layer with said pre-etching first ballistic electron beam.

19. A method of etching a thin film on a substrate using a plasma processing system having a ballistic electron beam and a plasma, comprising:
  forming a mask layer on said thin film, said mask layer comprising a pattern;
  forming a first ballistic electron beam in the absence of an atomic halogen specie by coupling negative polarity direct current (DC) power to an electrode in the plasma;
  exposing said substrate having said mask layer to said first ballistic electron beam to treat said mask layer;
  forming an etching plasma in said plasma processing system from an etching gas;
  forming a second ballistic electron beam in said plasma processing system by coupling negative polarity direct current (DC) power to an electrode in the plasma; and
  exposing said substrate to said etching plasma and said second ballistic electron beam in order to transfer said pattern to said thin film.

* * * * *